United States Patent [19]
Bergemont et al.

[11] Patent Number: 5,806,054
[45] Date of Patent: Sep. 8, 1998

[54] NEURON MOSFET MODULE STRUCTURE FOR BINARY LOGIC CIRCUITS

[75] Inventors: Albert Bergemont; Min-hwa Chi, both of Palo Alto, Calif.

[73] Assignee: National Semiconductor Corporation, Santa Clara, Calif.

[21] Appl. No.: 799,247

[22] Filed: Feb. 14, 1997

[51] Int. Cl.$^6$ .................................................. H03K 19/23
[52] U.S. Cl. ................... 706/33; 706/26; 706/41
[58] Field of Search .................................. 395/24, 23, 27; 706/33, 26, 41

[56] References Cited

U.S. PATENT DOCUMENTS

| | | | |
|---|---|---|---|
| 5,027,171 | 6/1991 | Reedy et al. | 357/23.5 |
| 5,258,657 | 11/1993 | Shibata et al. | 395/21 |
| 5,480,820 | 1/1996 | Roth et al. | 437/43 |
| 5,583,360 | 12/1996 | Roth et al. | 257/316 |
| 5,608,340 | 3/1997 | Shibata et al. | 326/36 |

OTHER PUBLICATIONS

Shibata, T. et al., "A Functional MOS Transistor Featuring Gate–Level Weighted Sum and Threshold Operations," IEEE Transactions on Electron Devices, vol. 39. No. 6, Jun. 1992, pp. 1444–1455.

Shibata, T. et al., "Neuron MOS Binary–Logic Integrated Circuits—Part I: Design Fundamentals and Soft–Hardware–Logic Circuit Implementation," IEEE Transactions on Electron Device, Vol. 40., No. 3, Mar. 1993, pp. 570–575.

Shibata, T. et al., "Neuron MOS Binary–Logic Integrated Circuits–Part II: Simplifying Techniques of Circuit Configuration and their Practical Applications," IEEE Transactions on Electron Devices, vol. 40, No. 5, May 1993, pp. 974–979.

*Primary Examiner*—George B. Davis
*Attorney, Agent, or Firm*—Limbach & Limbach L.L.P.

[57] ABSTRACT

A neuron MOSFET based module for use in the design and layout of binary logic circuits. In a first embodiment, the module is composed of four neuron MOSFETs arranged symmetrically to form a unit which may be combined with other such units to form more complex circuits. The MOSFETs are either n-channel or p-channel transistors. Each MOSFET has an associated floating gate and coupling region which can be selectively connected to the adjacent transistors in the module. Inputs to the module may be capacitively coupled to one or more of the coupling regions through an overlaying gate structure or by an appropriate set of doped substrate regions. Variations to the basic module structure include an embodiment formed from three neuron MOSFETs and the use of both n-channel and p-channel devices in the same module.

15 Claims, 12 Drawing Sheets

NEURON MOSFET MODULE STRUCTURE FOR BINARY LOGIC CIRCUITS

TECHNICAL FIELD

The present invention is directed to binary logic circuits used to simulate the operation of neurons, and more specifically, to a MOSFET based neuron module which can be used to systematically construct neural binary logic circuits for use in simulating a neural network.

BACKGROUND OF THE INVENTION

FIG. 1 shows a model for a human neuron 10. Neuron 10 has as inputs a set of signals, $V_i$ 12. Neuron 10 performs two primary functions: (1) a weighted summing of the product of input signals 12 and a set of weights $W_i$ 14, producing the expression $\Sigma(V_i W_i)$, to which is added a bias value (b) 16; and (2) a thresholding of the summed value $\Sigma(V_i W_i)+b$ by means of a sigmoid function 18. If the summed value exceeds the threshold value as determined by the sigmoid function, then the neuron "fires", i.e, produces an output signal, $V_o$ 20. Although neuron 10 of FIG. 1 is shown as having three inputs, it is understood that different numbers of inputs are possible.

FIG. 2(A) is a plan view of a first poly-capacitor coupled floating gate MOSFET transistor 30 which can be used to implement neuron 10 of FIG. 1. Neuron transistor 30 is shown in the figure as having three inputs, although a different number may be used if desired. The inputs are capacitively coupled to floating gate 34 by means of input gates 32 which overlie coupling region 35, where region 35 is an extension of gate 34. Floating gate 34 is formed from poly-1 and coupled with the inputs through poly-2 gates 32 whose capacitive coupling ratios represent the "weights" of the input signals.

The potential of floating gate 34 is the sum of the weighted inputs, $\Sigma(V_i W_i)$. The bias offset of the neuron can be implemented as inputs connected to Vcc or Vss. The operation of transistor 30 provides the neuron's sigmoid function, with its threshold voltage ($V_{TH}$) determining the threshold value which must be exceeded for "firing" of the neuron. When the potential of floating gate 34 is less than the threshold voltage of transistor 30 as seen from gate 34, the transistor is "off". This corresponds to the situation in which the neuron does not fire. When the potential of floating gate 34 is greater than the threshold voltage of transistor 30 as seen from gate 34, the transistor is "on". This corresponds to the situation in which the neuron fires. Transistor 30 can be either n-channel or p-channel. Other circuit elements such as a CMOS inverter can be substituted for transistor 30 in order to provide different thresholding functions.

MOSFET transistor 30 includes source 36 and drain 37 regions which are formed in a lightly-doped substrate, and a layer of gate oxide which is formed over a channel region defined between the source and drain regions. As noted, MOSFET transistor 30 also includes floating gate 34 which is formed over the layer of gate oxide and a layer of interpoly dielectric which is formed over floating gate 34. A series of spaced-apart input gates 32 are formed over the layer of interpoly dielectric.

In operation, the voltages (signals) applied to input gates 32 are capacitively coupled to floating gate 34 through coupling region 35, which is an extension of gate 34. Floating gate 34 causes transistor 30 to turn on when the potential on floating gate 34 is sufficient to form a conducting channel underneath the layer of gate oxide (and appropriate voltages are applied to the source and drain regions).

As noted, the potential on floating gate 34 is defined by the linear sum of all the voltages applied to input gates 32, as weighted by the corresponding capacitive coupling coefficients between the input gates and the floating gate. The weight of the capacitive coupling coefficients is determined by the relative area consumed by each of the input gates.

As a result, floating gate 34 calculates the weighted sum of each of the input voltages, and then turns on transistor 30 when the weighted sum exceeds the turn-on potential of floating gate 34. By responding to a weighted sum in this manner, transistor 30 resembles a biological neuron that "fires" in response to different multiple-input conditions.

FIG. 2(B) is a plan view of a second poly-capacitor coupled floating gate MOSFET transistor 31 which can be used to implement neuron 10 of FIG. 1. The primary difference between the neuron MOSFETs of FIGS. 2(A) and 2(B) is that the poly-2 layer used to form input gates 32, which couples the input signals to floating gate 34 through coupling region 35, is replaced by a series of doped substrate regions 33. As a result, neuron MOSFET 31 can be formed by using a modified single-poly fabrication process rather than the more complex double-poly process that is used to form conventional neuron MOSFETs, such as that shown in FIG. 2(A). A more detailed description of the structure and process of making the neuron MOSFET of FIG. 2(B) is found in U.S. Pat. application Ser. No. 08/684,410, filed Jul. 19, 1996, U.S. Pat. No. 5,753,954 assigned to the assignee of the present application, and the contents of which are hereby incorporated by reference.

FIG. 3 is a schematic diagram of an exclusive OR (XOR) circuit 40 based on the poly-capacitor coupled neuron MOSFETs of FIGS. 2(A) and 2(B). Exclusive OR circuit 40 is composed of inverters of neuron MOSFETs and regular inverters. The inputs to circuit 40 are signals $V_1$ and $V_2$ 42. Input signals 42 are capacitively coupled to floating gates 45 and 47 of neuron MOSFET inverters 44 and 46, respectively, by means of capacitors having coupling values (weights) w1, w2, and w3. Inverter 44 functions as a pre-input gate inverter for neuron circuit 46. A bias value for the neurons is provided by a capacitive coupling of Vcc to the floating gates using a coupling value w4. The output of neuron stage 46 is passed through inverter stage 48 to produce the final output 50. Although FIG. 3 shows the implementation of an XOR function, other boolean functions may also be implemented by using proper configurations of neuron MOSFETs.

As the use of neuron MOSFETs to implement signal processing functions increases, it is desirable to develop a systematic design approach for optimizing the design of such neuron logic circuits. This would streamline the design and layout process, and provide a uniform and standardized end product. In addition to the usual design issues, such an approach should be concerned with minimizing coupling area, maximizing accuracy, optimizing interconnection routing, and other aspects of particular concern when using neuron MOSFETs.

What is desired is a means of implementing a systematic approach to the design and layout of neuron MOSFET based logic circuits. These and other advantages of the present invention will be apparent to those skilled in the art upon a reading of the Detailed Description of the Invention together with the drawings.

SUMMARY OF THE INVENTION

The present invention is directed to a neuron MOSFET based module for use in the design and layout of binary logic circuits. In a first embodiment, the module is composed of four neuron MOSFETs arranged symmetrically to form a unit which may be combined with other such units to form more complex circuits. The MOSFETs may be either n-channel or p-channel transistors. Each MOSFET has an associated floating gate and coupling region which can be selectively connected to the adjacent transistors in the module. Inputs to the module may be capacitively coupled to one or more of the coupling regions through an overlaying gate structure or by means of an appropriate set of doped substrate regions. Variations to the basic module structure include an embodiment formed from three neuron MOSFETs and the use of both n-channel and p-channel devices in the same module.

Further objects and advantages of the present invention will become apparent from the following detailed description and accompanying drawings.

DETAILED DESCRIPTION OF THE INVENTION

Figure 1:
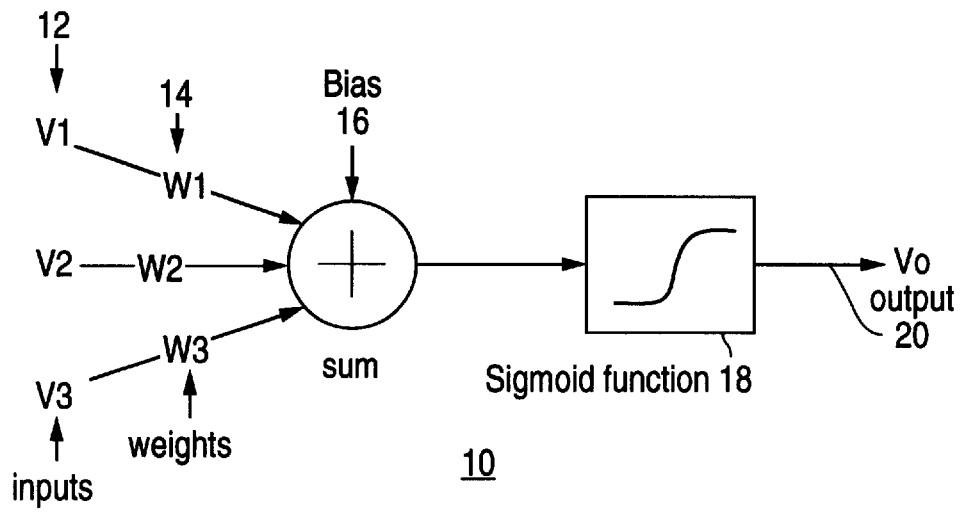
FIG. 1 shows a model for a human neuron.
Figure 2A:
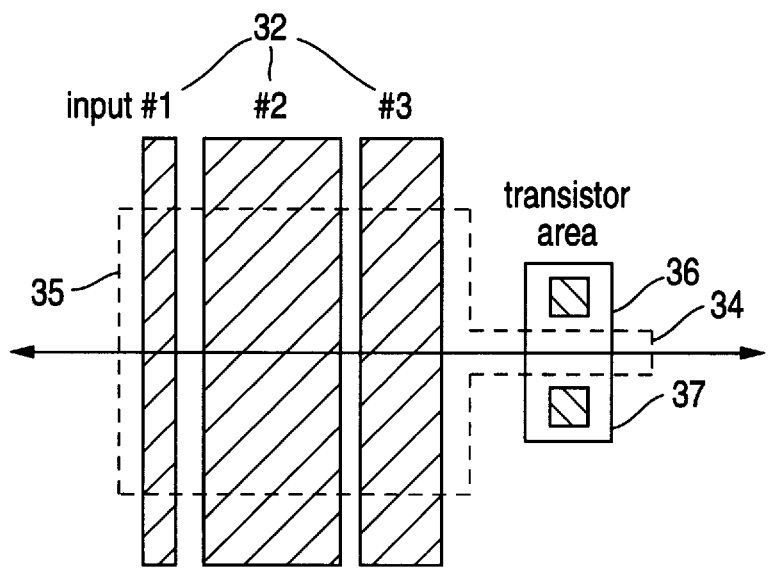
FIG. 2(A) is a plan view of a first poly-capacitor coupled floating gate MOSFET transistor which can be used to implement the neuron of FIG. 1.
Figure 4A:
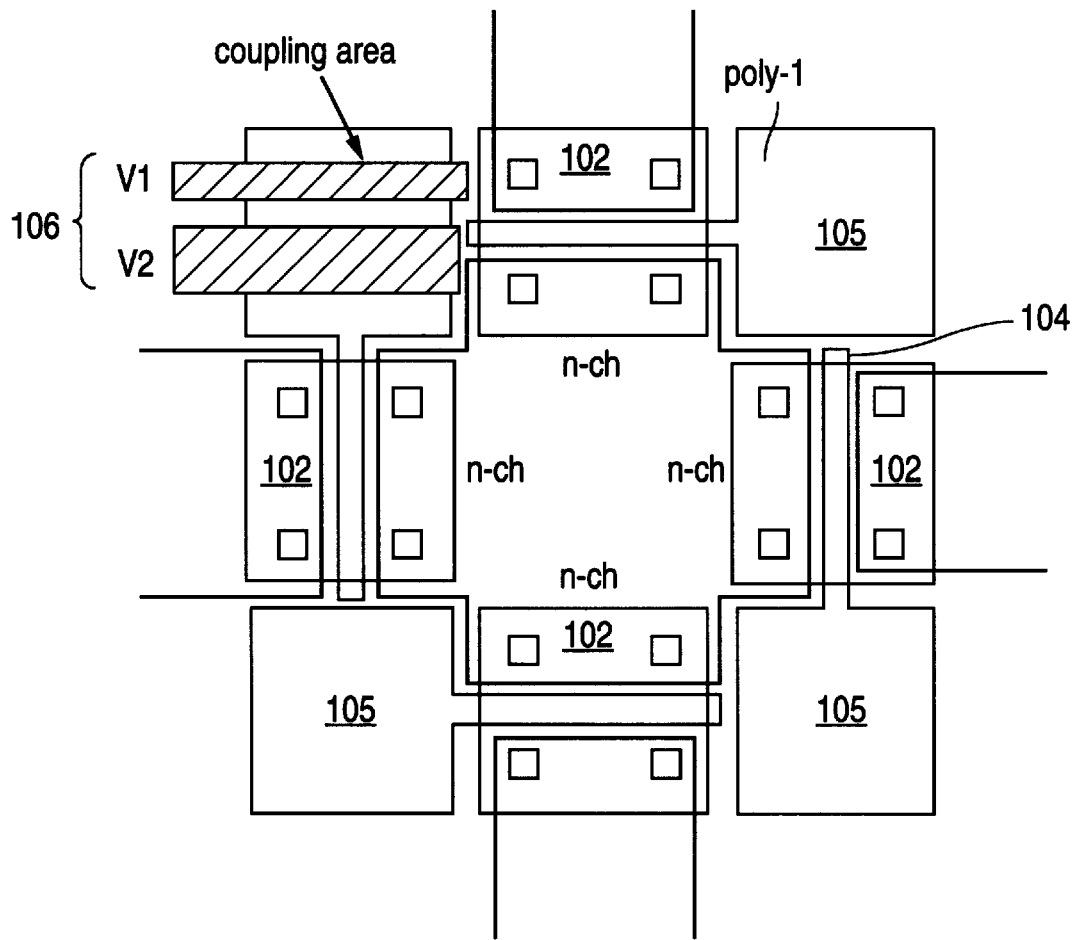
FIG. 4(A) shows the layout for an embodiment of the neuron MOSFET module of the present invention which is composed of four MOSFET transistors and uses the input coupling scheme of FIG. 2(A).

FIG. 4(A) shows the layout for an embodiment of the neuron MOSFET module 100 of the present invention which is composed of four MOSFET transistors and uses the input coupling scheme of FIG. 2(A). As shown in the figure, neuron MOSFET module 100 is composed of four n-channel MOSFETs 102, each with an associated floating gate 104 which is extended to form a coupling region 105 for the devices. Input gates 106 are formed from a poly-2 layer and are used to capacitively couple the input signals (labelled "V1" and "V2" in the figure) to the floating gates 104 by means of coupling regions 105. The n-channel MOSFETs 102 are fabricated using a standard process flow well known in the semiconductor industry. Floating gates 104 are formed from a poly-1 layer applied over the channel regions of the respective transistors. The portion of floating gates 104 extending beyond the channel regions of the transistors form coupling region 105 which permits the input signals to be coupled to module 100. Input gates 106 are formed from a poly-2 layer applied over the desired floating gate coupling region 105. In the example of FIG. 4(A), each of coupling regions 105 is connected to one of the four transistors 102, and input gates 106 are capacitively coupled to a single one of the coupling regions.

Figure 2B:
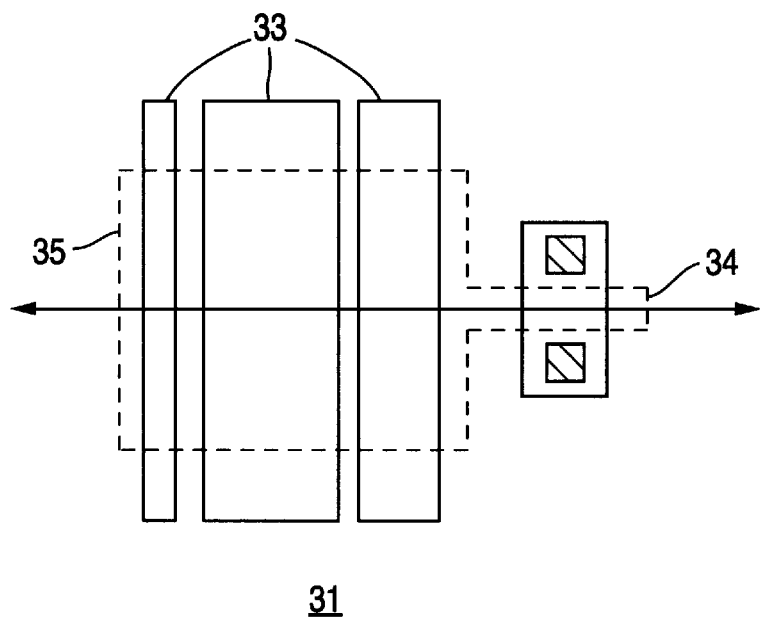
FIG. 2(B) is a plan view of a second poly-capacitor coupled floating gate MOSFET transistor which can be used to implement the neuron of FIG. 1.
Figure 4B:
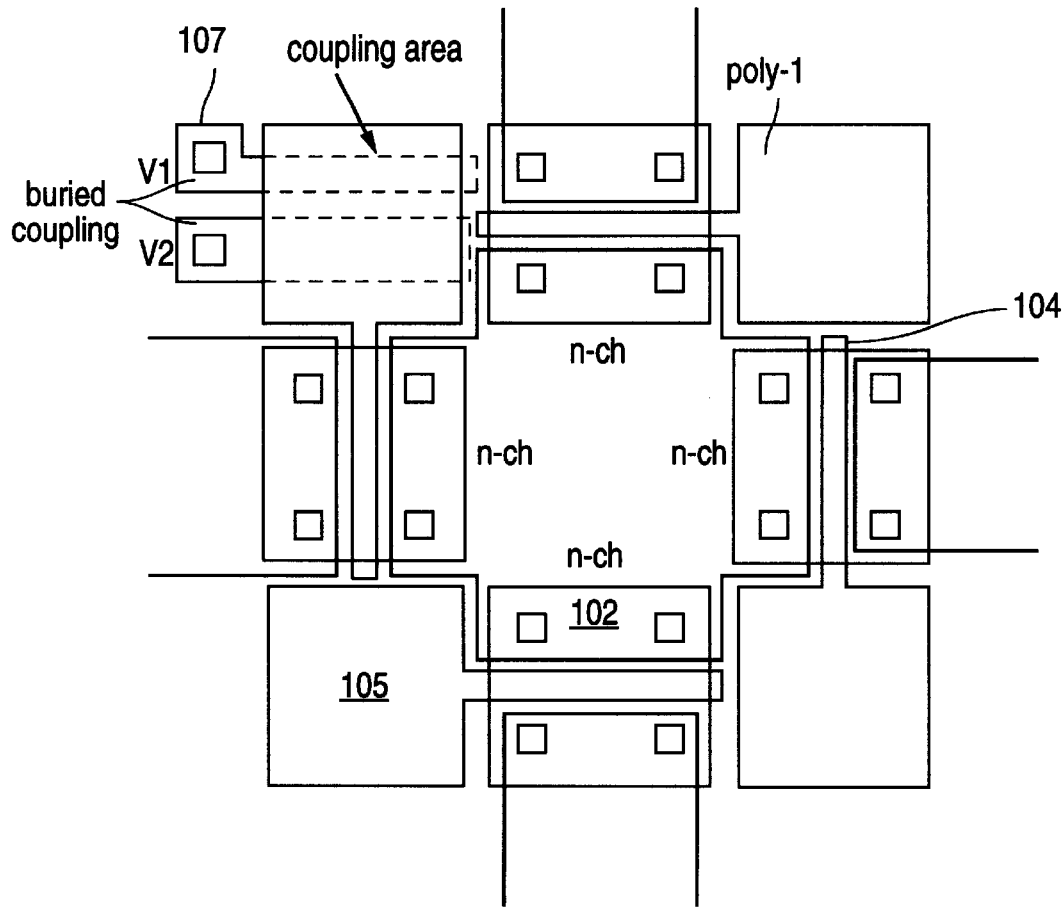
FIG. 4(B) shows the layout for an embodiment of the neuron MOSFET module of the present invention which is composed of four MOSFET transistors and uses the input coupling scheme of FIG. 2(B).

FIG. 4(B) shows the layout for an embodiment of the neuron MOSFET module 100 of the present invention which is composed of four MOSFET transistors and uses the input coupling scheme of FIG. 2(B). As discussed, the difference between the structures of FIGS. 4(A) and 4(B) is that the input signals are coupled to coupling regions 105 and hence to floating gates 104 by means of buried diffusion regions 107 under the coupling regions.

The four MOSFETs and associated floating gate coupling regions which compose module 100 are arranged in a symmetric, regular shape, in this case a square. Because this arrangement results in a module having the same structure on each side (aside from the input gates), it permits use of the module as a tile or building block to form more complicated circuits. This is accomplished by combining multiple ones of the modules into a larger circuit, with a desired set of interconnections being formed by connecting the coupling region of one transistor to the floating gate or coupling region of an adjacent transistor as desired. Multiple sets of input gates, or coupling between a single set of input gates and more than one coupling region may also be used to construct a desired neural circuit.

Figure 5:
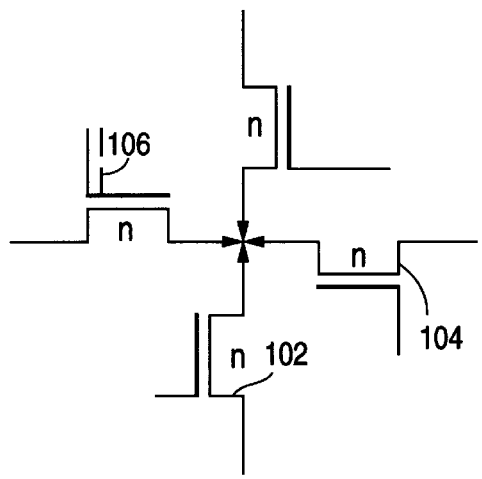
FIG. 5 is a schematic diagram of the neuron MOSFET module of FIGS. 4(A) and 4(B).

FIG. 5 is a schematic diagram of neuron MOSFET module 100 of FIGS. 4(A) and 4(B). As the four MOSFET transistors 102 are formed on the same substrate, they have a common drain connection. Floating gates 104 and input gate 106 are also shown in the figure.

Figure 6A:
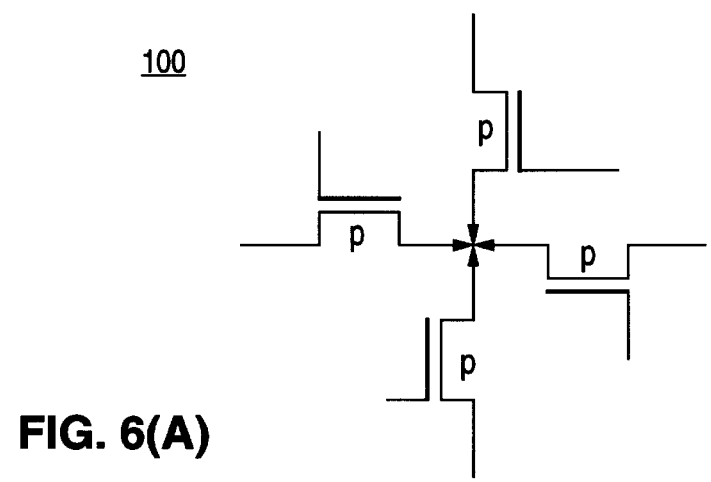
FIGS. 6(A) and 6(B) are schematic diagrams of alternative versions of the neuron MOSFET module of FIGS. 4(A) and 4(B).
Figure 6B:
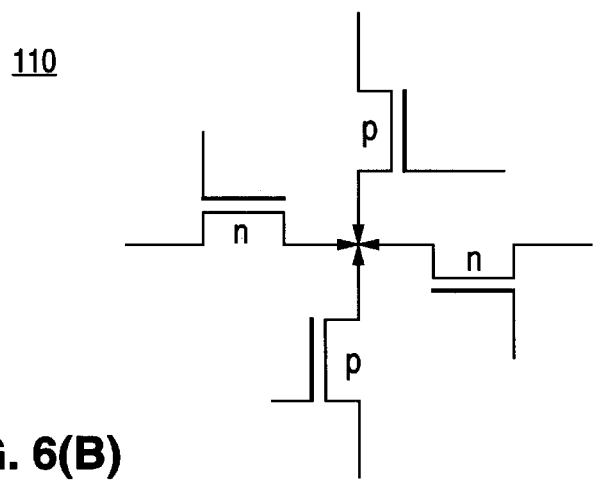

FIGS. 6(A) and 6(B) are schematic diagrams of alternative versions of neuron MOSFET module 100 of FIGS. 4(A) and 4(B). FIG. 6(A) shows a version 110 of module 100 formed from four p-channel transistors. FIG. 6(B) shows a version 110 of module 100 formed from a mixture of n-channel and p-channel devices.

Figure 7:
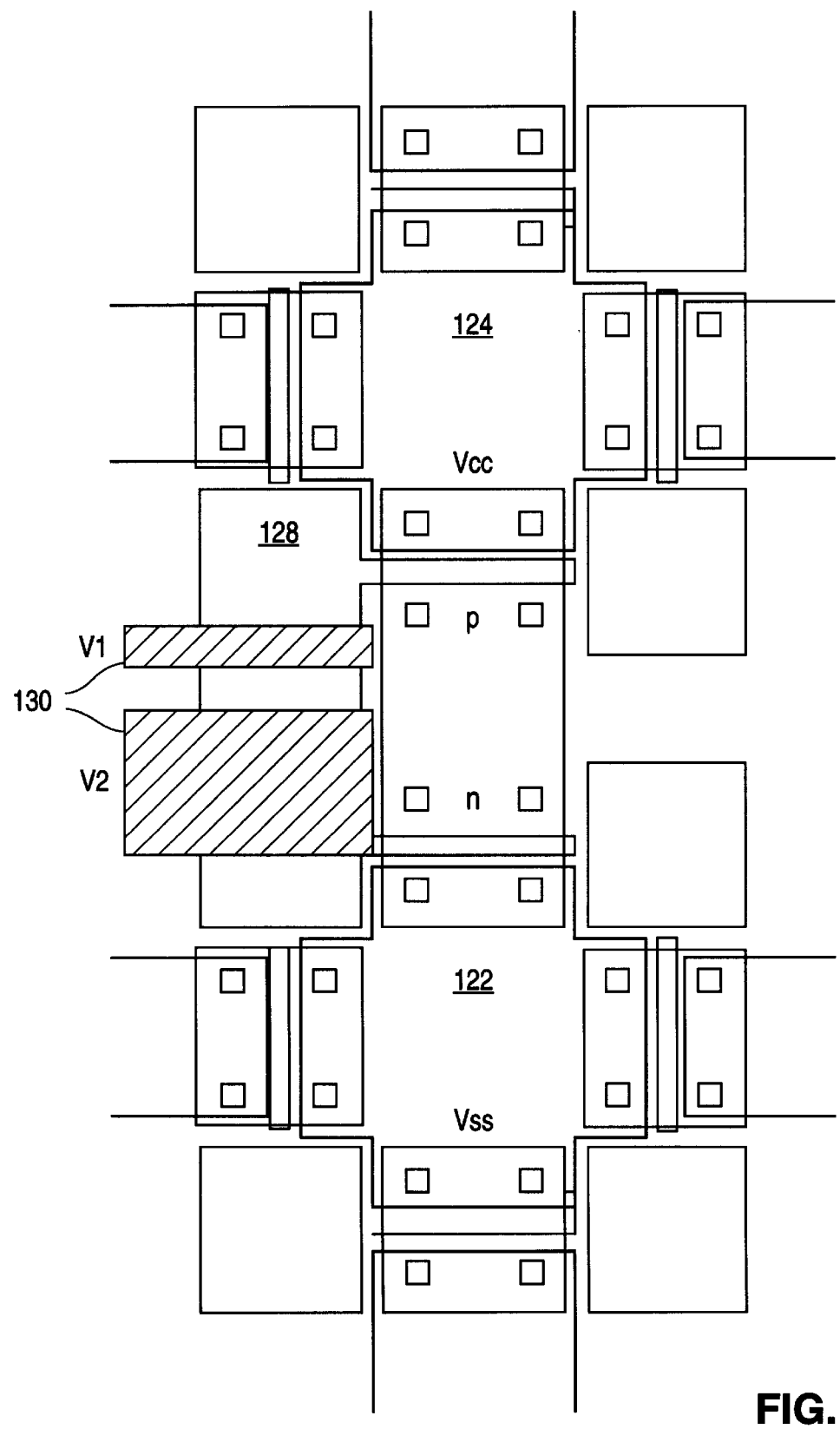
FIG. 7 shows the layout for a two input floating gate inverter formed from the neuron MOSFET modules of the present invention wherein the inputs are coupled to a common floating gate.

FIG. 7 shows the layout for a two input floating gate inverter 120 formed from the neuron MOSFET modules of the present invention. Inverter 120 is composed of one n-channel 122 and one p-channel 124 neuron MOSFET module which are interconnected by means of a common coupling region 128. Region 128 connects the floating gate of one of the n-channel devices to the floating gate of one of the p-channel devices. Input gates 130 are capacitively coupled to coupling region 128 and hence both inputs are common to both neuron MOSFET modules. The unused (uncommitted) transistors and floating gate coupling regions are not interconnected.

FIG. 7 shows how a single inverter is formed using the modules of the present invention. As noted, there are unused transistors and coupling regions shown in the figure. When implementing larger circuits, the most efficient utilization of the transistors and coupling regions for a specific application is determined by software programs.

Figure 8:
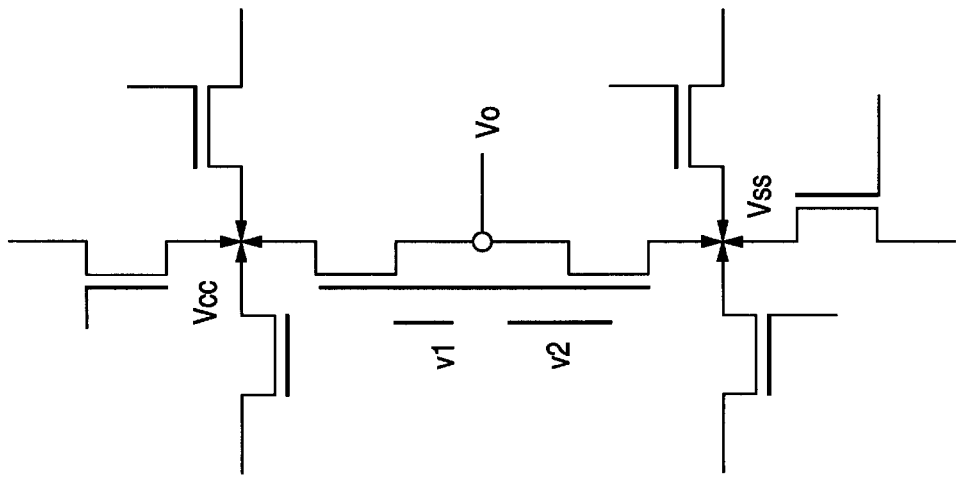
FIG. 8 is a schematic diagram of the two input floating gate inverter formed from neuron MOSFET modules of FIG. 7.

FIG. 8 is a schematic diagram of two input floating gate inverter 120 formed from neuron MOSFET modules of FIG. 7. As shown in FIG. 7, input signals v1 and v2 are coupled to the same floating gate, which is common to both the p-channel and n-channel device.

Note that the four MOSFET module shown in the preceding figures may be converted to CMOS transistors by eliminating the floating gate layout and using a poly-2 layer as the gate. Thus, a standard CMOS inverter can also be implemented using the neuron modules described herein.

Figure 9:
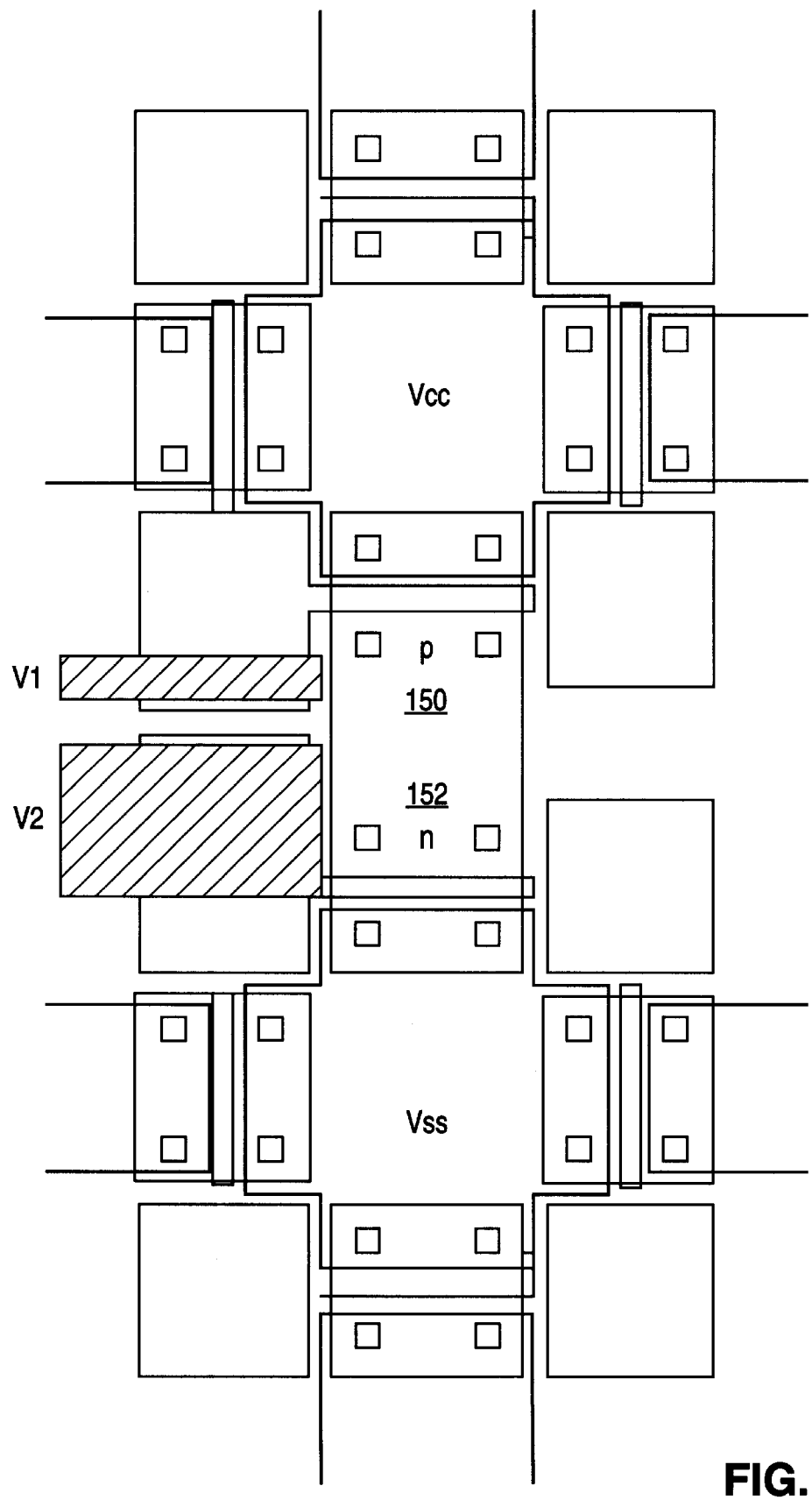
FIG. 9 shows the layout for a two input floating gate inverter formed from the neuron MOSFET modules of the present invention wherein the inputs are coupled to different floating gates.

FIG. 9 shows the layout for a two input floating gate inverter formed from the neuron MOSFET modules of the present invention wherein the inputs are coupled to different floating gates. Note that in this inverter structure the floating gates of p-channel transistor 150 and n-channel transistor 152 are not connected by the intermediate coupling region as they are in the layout of FIG. 7. This variation of the inverter of FIG. 7 is obtained by laying out the neuron MOSFET modules of the present invention in such a manner that the poly-1 floating gate coupling region is not common to transistors 150 and 152. Thus, in this example the input signals are not coupled to a common gate, so that the input signals are not common to both neuron MOSFET modules. This type of inverter is designed so that its p-channel and n-channel transistor threshold voltages have different values. For example, the threshold voltage viewed from v1 is $V_{tp}/\gamma_1$, while the threshold voltage viewed from v2 is $V_{tn}/\gamma_2$, where $V_{tp}$ is the threshold voltage of the p-channel transistor, etc. This arrangement allows each transistor of the inverter to have a different trip point.

Figure 10:
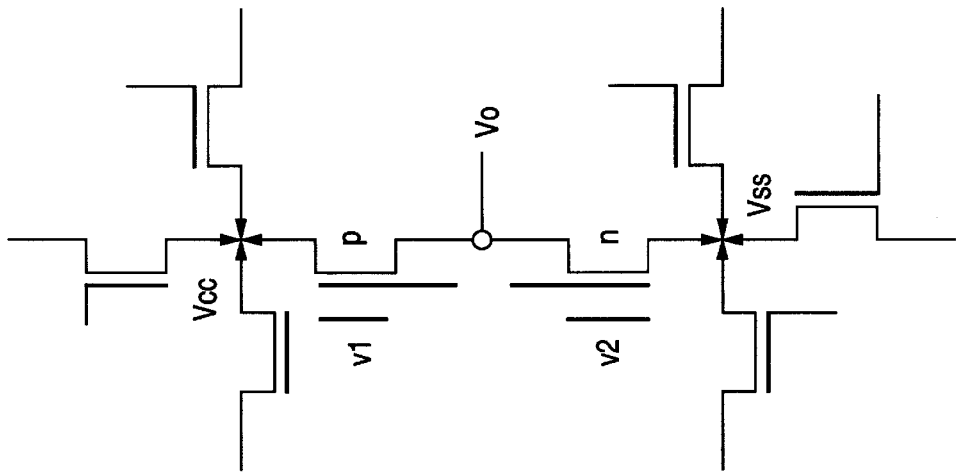
FIG. 10 is a schematic diagram of the two input floating gate inverter formed from neuron MOSFET modules of FIG. 9.

FIG. 10 is a schematic diagram of the two input floating gate inverter formed from neuron MOSFET modules of FIG. 9. As shown in FIG. 9, input signals v1 and v2 are coupled to different floating gates.

Figure 11:
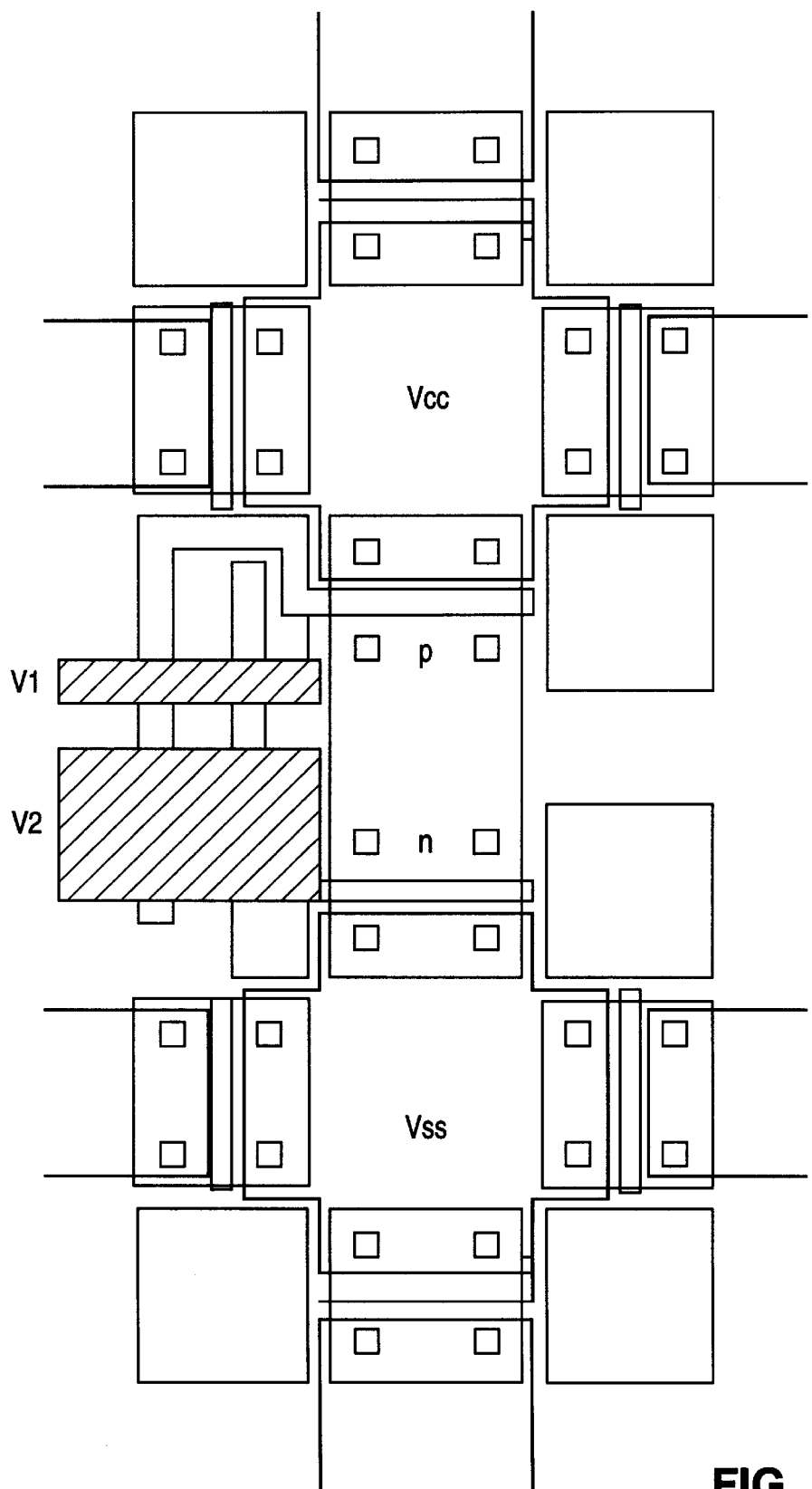
FIG. 11 shows the layout for a two input floating gate inverter formed from the neuron MOSFET modules of the present invention wherein the inputs are capacitively coupled to each transistors' floating gate.

FIG. 11 shows the layout for a two input floating gate inverter formed from the neuron MOSFET modules of the present invention wherein the inputs are capacitively coupled to each transistors' floating gate, and the floating gates of the two transistors are electrically isolated. This inverter design is such that both the p-channel and n-channel transistor can be "on" at the same time (e.g., v1 "high" and v2 "low"). This is useful for analog applications and is difficult to implement using a conventional inverter, such as the type shown in FIG. 8.

Figure 12:
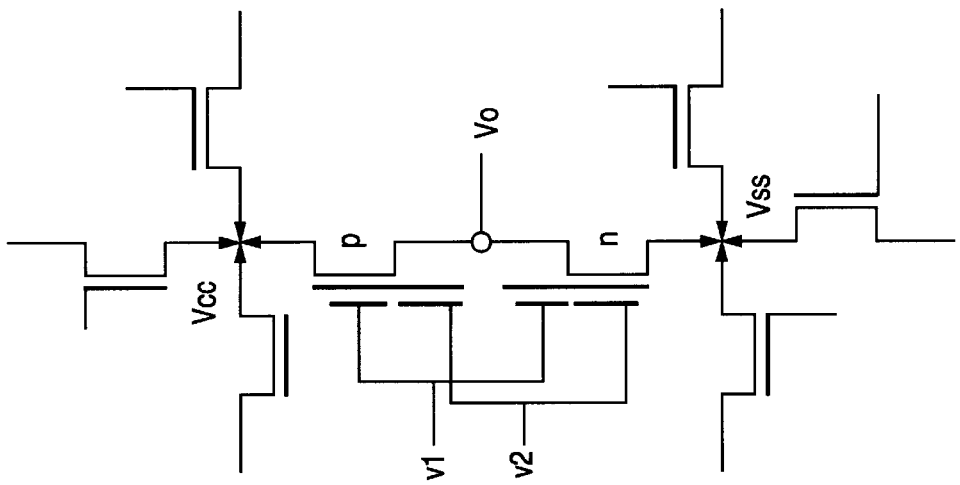
FIG. 12 is a schematic diagram of the two input floating gate inverter formed from neuron MOSFET modules of FIG. 11.

FIG. 12 is a schematic diagram of the two input floating gate inverter formed from neuron MOSFET modules of FIG. 11.

Figure 3:
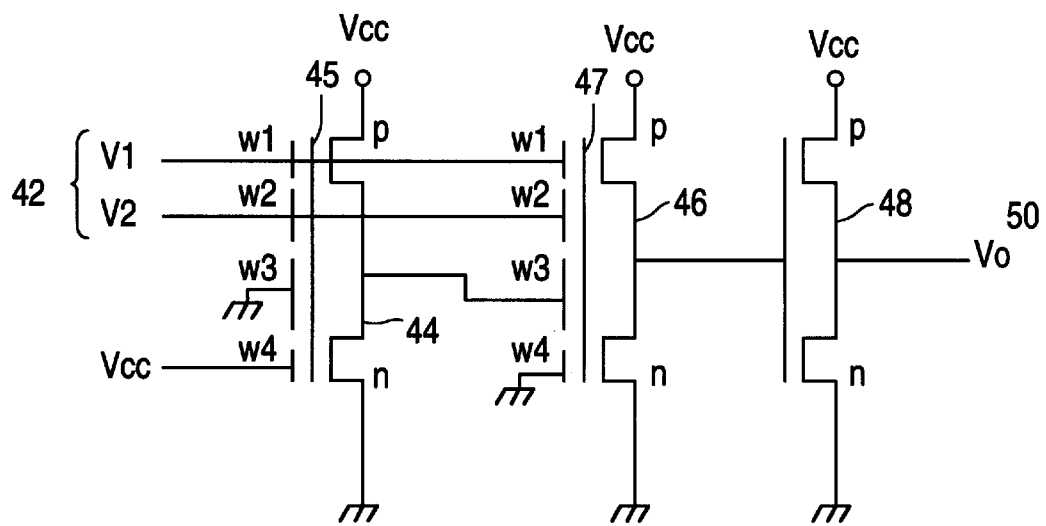
FIG. 3 is a schematic diagram of an exclusive OR (XOR) circuit based on the poly-capacitor coupled neuron MOSFET of FIGS. 2(A) and 2(B).
Figure 13:
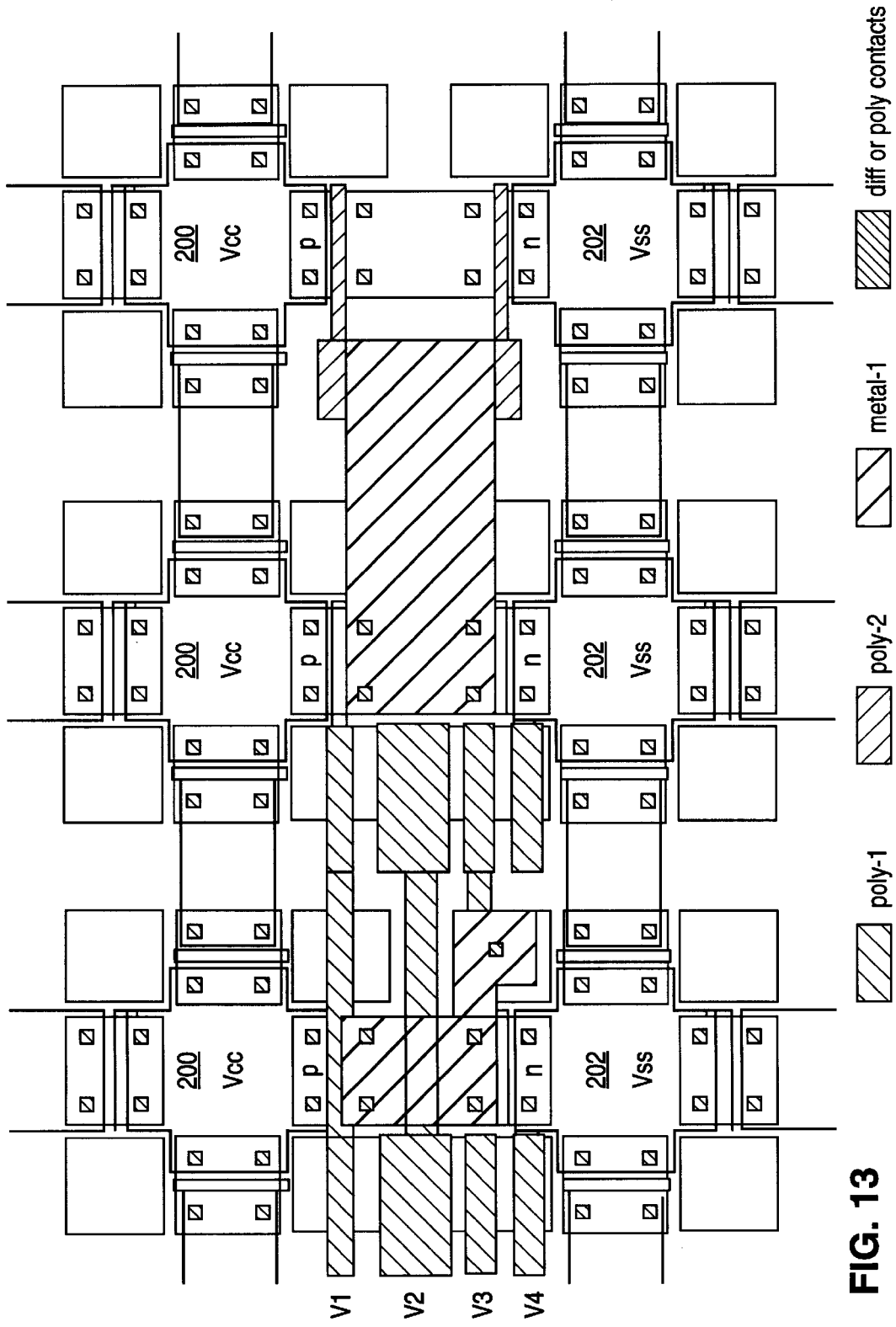
FIG. 13 shows a layout for the exclusive OR circuit of FIG. 3 using the neuron MOSFET modules of the present invention.

FIG. 13 shows a layout for the exclusive OR circuit of FIG. 3 using the neuron MOSFET modules of the present invention. As shown in the figure, the XOR circuit is composed of 3 p-channel MOSFET modules 200 and 3 n-channel MOSFET modules 202. The desired interconnections between the input gates and the coupling regions, and between the floating gates of the individual transistors are achieved by variations in the layout of the layers of material. The symmetry of the neuron MOSFET module of the present invention permits the generation of an array of such circuits in a systematic and area efficient manner, while retaining the flexibility to permit application specific requirements to be implemented.

The preceding figures demonstrate the flexibility of the present invention; minor changes in the layout relationship between the input gates and the floating gates, and with regards to interconnection of the coupling regions can produce different and useful inverter designs. As the inverter is a basic element of more complex circuitry and can be used to mimic the operation of a human neuron, it is apparent that the neuron MOSFET module described herein can form the building block for efficient implementation of processing circuits.

Some of the possible variations in using the present invention include combining the poly-1 coupling region on the corner of each module with an adjacent coupling region of another module. This provides a larger coupling region having a more accurate coupling ratio. The coupling region can then be connected to any or all of the adjacent transistors in the module.

For example, in order to obtain a circuit having an increased pull-up capability, the poly-1 layer of all four p-channel transistors in a module are connected together and the drains of the transistors are connected to the n-channel of an inverter. In order to obtain a circuit having a increased pull-down capability, the poly-1 layer of all four n-channel transistors in a module are connected together and the drains of the transistors are connected to the p-channel of an inverter.

Interconnection of different neuron MOSFET modules to form larger blocks can be accomplished using poly-2 and metal layers. The poly-2 lines provide coupling to the floating gates of the transistors and can be used to form interconnects to immediate neighbor transistors. Poly-1 and buried diffusion regions may also be used to provide interconnections between elements of the same module. The metal layers can be used for longer range interconnections between modules for providing feedback, signal shielding, power, etc.

An important consideration in the design of circuits based on the neuron MOSFET module of the present invention is the minimization of gate coupling area. This is important because minimizing the dimensions of the coupling area permits the construction of denser circuits. The minimum required coupling area is determined by the desired accuracy of the weights. For example, if the ratio of the largest weight to the smallest weight is 100, and the poly-1 critical dimension is approximately 1 micron, then the minimum dimension of the coupling region is 100 microns per side. In order to reduce this dimension, the poly-1 critical dimension needs to be reduced and/or the relative weights need to be limited to a smaller value.

Figure 14:
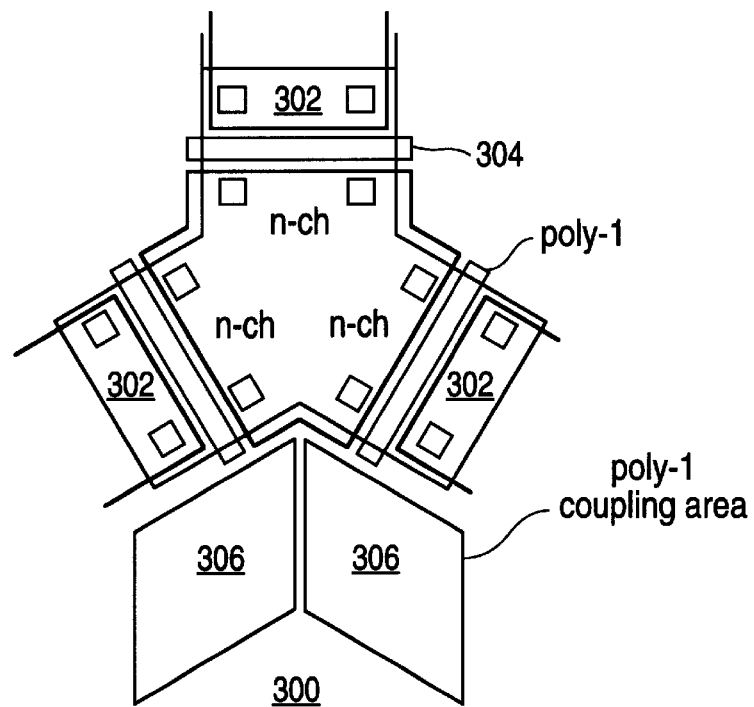
FIG. 14 shows the layout for a second embodiment of the neuron MOSFET module of the present invention which is composed of three MOSFET transistors and can be used with the input coupling scheme of either FIG. 2 (A) or 2 (B).

FIG. 14 shows the layout for a second embodiment of the neuron MOSFET module of the present invention which is composed of three MOSFET transistors and can be used with the input coupling scheme of either FIG. 2(A) or 2(B). As shown in the figure, neuron MOSFET module 300 is composed of three n-channel MOSFETs 302, each with an associated floating gate 304. Additional poly-1 regions 306 form a coupling region for the devices in adjacent modules. As was discussed with reference to the four transistor embodiment, during the layout process, coupling regions 306 may be connected to the floating gates or input gates of adjacent transistors as is required to build a desired circuit element.

Figure 15:
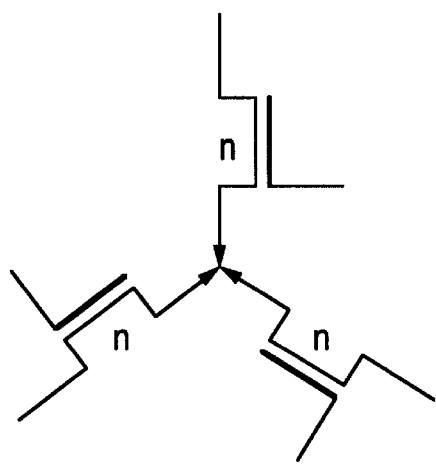
FIG. 15 is a schematic diagram of the neuron MOSFET module of FIG. 14.

FIG. 15 is a schematic diagram of the neuron MOSFET module of FIG. 14. As is shown in the figure, the three transistors share a common connection through the substrate on which they are fabricated.

Figure 16:
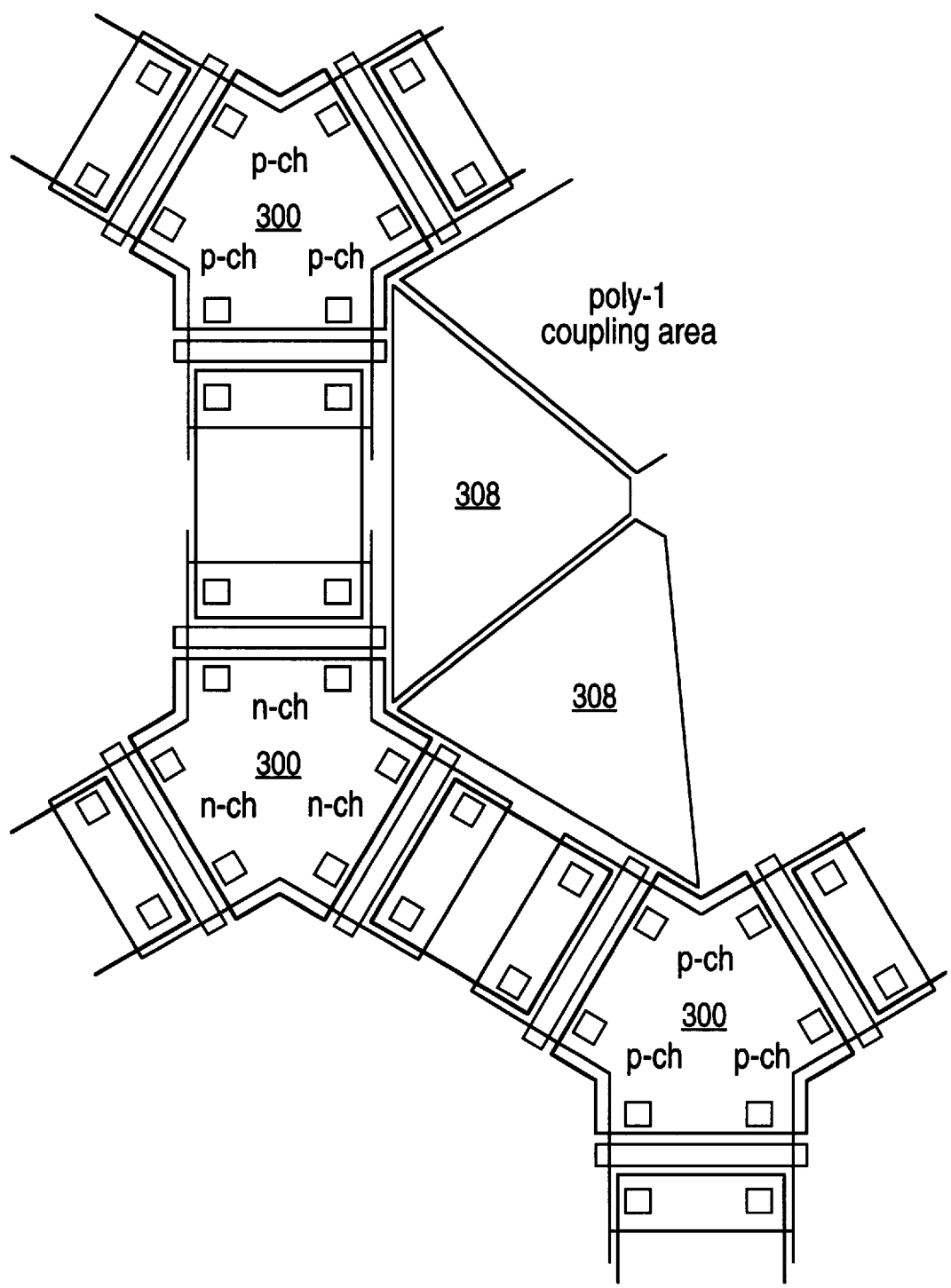
FIG. 16 shows a device which is a combination of the three transistor neuron MOSFET module of FIG. 14.

FIG. 16 shows how multiple ones of the three transistor neuron MOSFET module 300 of FIG. 14 may be combined to form a more complicated device. The symmetric shape of module 300 permits its use as a basic tile for filling a space in an area efficient manner. In FIG. 16, another example of a poly-1 coupling area 308 suitable for use with the three transistor module is shown. By varying the layout details, the coupling area may be electrically connected to one or more of the floating gates or input gates of the component transistors. This permits a wide variety of data input configurations and neuron MOSFET based devices to be constructed. In addition, FIG. 16 shows how both n-channel and p-channel based modules may be combined to form a desired circuit.

The neuron MOSFET module of the present invention may be implemented in a variety of configurations. Both three and four transistor modules have been described herein, although other numbers may of course be used. N-channel or p-channel transistors may be used to form the modules, or a combination of the two types of devices. The input signals may be capacitively coupled to the coupling regions (and hence the floating gates) by means of an overlying input gate formed from a poly-2 layer, or by means of appropriately doped substrate regions.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A neuron MOSFET module for use in constructing binary logic circuits, comprising:

a plurality of neuron MOSFET transistors formed on a common substrate and arranged into a symmetric shape to form a tile for covering a surface area, each neuron MOSFET having an associated floating gate positioned over a channel region formed between a source region and a drain region;

a plurality of coupling regions, each coupling region arranged adjacent to one of the MOSFET transistors, the coupling regions being selectively interconnected with the floating gate of the respective adjacent transistor and with others of the coupling regions; and a signal input region electrically coupled to one of the plurality of coupling regions.

2. The neuron MOSFET module of claim 1, wherein the MOSFET transistors are n-channel devices.

3. The neuron MOSFET module of claim 1, wherein the MOSFET transistors are p-channel devices.

4. The neuron MOSFET module of claim 1, wherein the MOSFET transistors are n-channel and p-channel devices.

5. The neuron MOSFET module of claim 1, wherein the module is formed from four neuron MOSFET transistors.

6. The neuron MOSFET module of claim 1, wherein the neuron MOSFET transistors and the adjacent coupling regions are arranged in a symmetric shape to form a tile for covering a surface area.

7. The neuron MOSFET module of claim 1, wherein the signal input region is formed from an input gate arranged over and electrically coupled to one of the plurality of coupling regions.

8. The neuron MOSFET module of claim 1, wherein the signal input region is formed from a doped substrate region which is electrically coupled to one of the plurality of coupling regions.

9. A neuron MOSFET module for use in constructing binary logic circuits, comprising:

a plurality of neuron MOSFET transistors formed on a common substrate and arranged into a symmetric shape to form a tile for covering a surface area, each neuron MOSFET having an associated floating gate positioned over a channel region formed between a source region and a drain region;

a coupling region arranged adjacent to one of the MOSFET transistors, the coupling region being selectively interconnected with the floating gates of one or more of the transistors; and a signal input region electrically coupled to the coupling region.

10. The neuron MOSFET module of claim 9, wherein the MOSFET transistors are n-channel devices.

11. The neuron MOSFET module of claim 9, wherein the MOSFET transistors are p-channel devices.

12. The neuron MOSFET module of claim 9, wherein the MOSFET transistors are n-channel and p-channel devices.

13. The neuron MOSFET module of claim 9, wherein the module is formed from three neuron MOSFET transistors.

14. The neuron MOSFET module of claim 9, wherein the signal input region is formed from an input gate arranged over and electrically coupled to the coupling region.

15. The neuron MOSFET module of claim 9, wherein the signal input region is formed from a doped substrate region which is electrically coupled to the coupling region.

* * * * *